(12) United States Patent
Pyon et al.

(10) Patent No.: US 7,728,229 B2
(45) Date of Patent: Jun. 1, 2010

(54) MULTI-STABILIZED NBTI COMPOSITE SUPERCONDUCTING WIRE

(75) Inventors: Taeyoung Pyon, Watertown, CT (US); Michael Dormody, Bristol, CT (US); Ben Karlemo, Pori (FI)

(73) Assignee: Luvata Espoo Oy, Espoo (FI)

( * ) Notice: Subject to any disclaimer, the term of this patent is extended or adjusted under 35 U.S.C. 154(b) by 321 days.

(21) Appl. No.: 11/692,974

(22) Filed: Mar. 29, 2007

(65) Prior Publication Data
US 2009/0114414 A1 May 7, 2009

(51) Int. Cl.
*H01B 12/00* (2006.01)
(52) U.S. Cl. .................................. 174/125.1
(58) Field of Classification Search ............. 174/125.1, 174/126.1, 126.2, 36, 102 R, 103, 106 R, 174/128.1, 128.2, 129 R
See application file for complete search history.

(56) References Cited

U.S. PATENT DOCUMENTS

| | | | |
|---|---|---|---|
| 4,148,129 A | 4/1979 | Young | |
| 4,242,536 A | 12/1980 | Young | |
| 4,506,109 A | 3/1985 | Onishi et al. | |
| 4,652,697 A | 3/1987 | Ando et al. | |
| 4,659,007 A | 4/1987 | Onishi et al. | |
| 4,743,713 A | 5/1988 | Scanlan | |
| 5,088,183 A * | 2/1992 | Kanithi | 29/599 |
| 5,189,386 A * | 2/1993 | Tada et al. | 335/216 |
| 5,266,416 A | 11/1993 | Inoue et al. | |
| 5,369,873 A * | 12/1994 | Walters et al. | 29/599 |
| 5,689,875 A * | 11/1997 | Kanithi | 29/599 |
| 5,873,158 A * | 2/1999 | Sulten et al. | 29/599 |
| 6,038,759 A * | 3/2000 | Teuho | 29/599 |
| 6,255,596 B1 * | 7/2001 | Hosono et al. | 174/125.1 |
| 6,311,926 B1 | 11/2001 | Powell et al. | |
| 6,324,746 B1 * | 12/2001 | Bruzek et al. | 29/599 |
| 6,470,564 B1 * | 10/2002 | Wada | 29/599 |
| 6,508,888 B1 | 1/2003 | Leroy | |
| 7,155,806 B2 | 1/2007 | Rossi | |

\* cited by examiner

*Primary Examiner*—William H Mayo, III
(74) *Attorney, Agent, or Firm*—Hodgson Russ LLP

(57) ABSTRACT

A light-weight, aluminum core, multi-stabilized, superconducting wire. The superconducting wire has NbTi superconducting filaments embedded in a normal stabilizing copper metal matrix that encapsulates an aluminum central core.

13 Claims, 5 Drawing Sheets

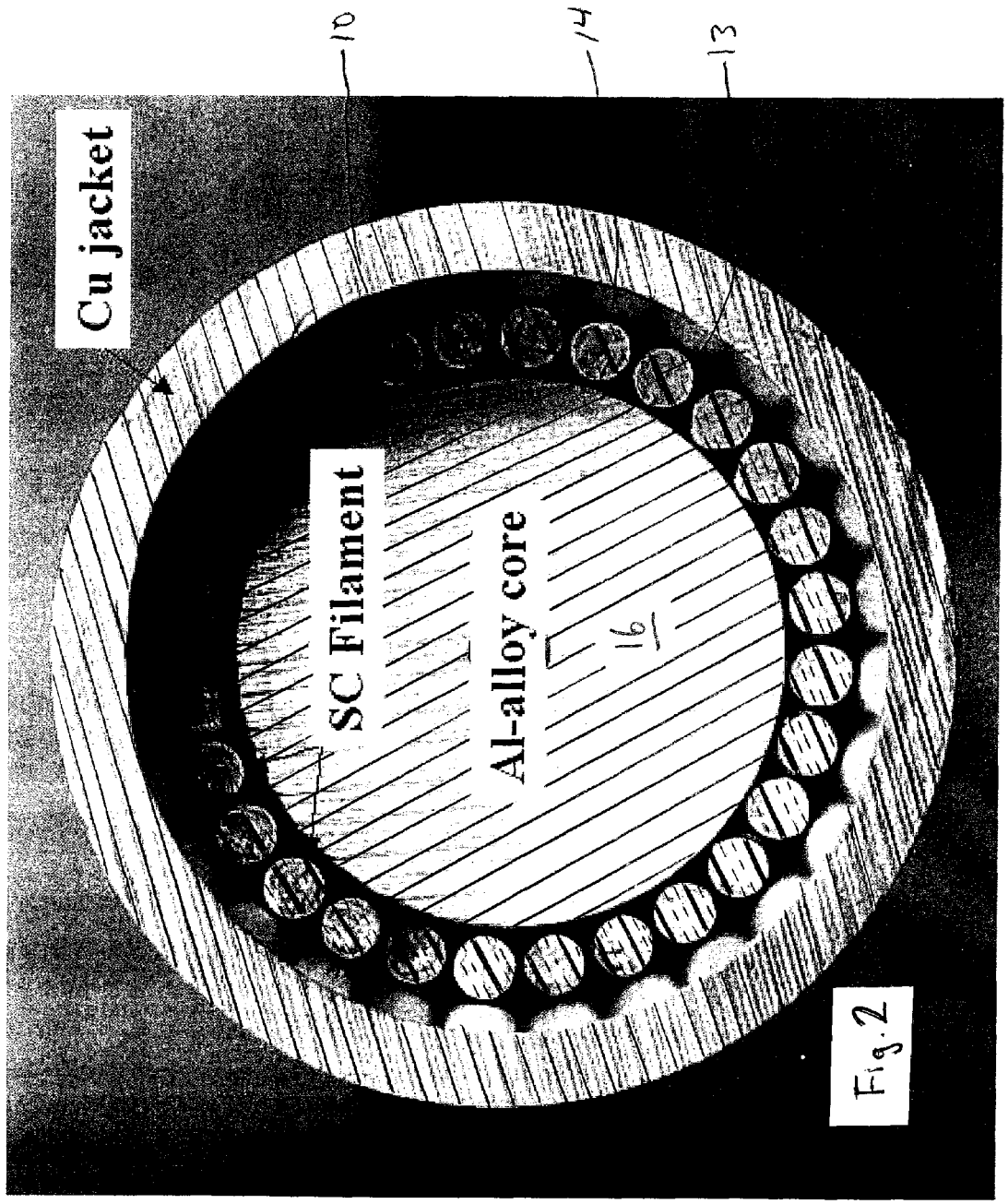

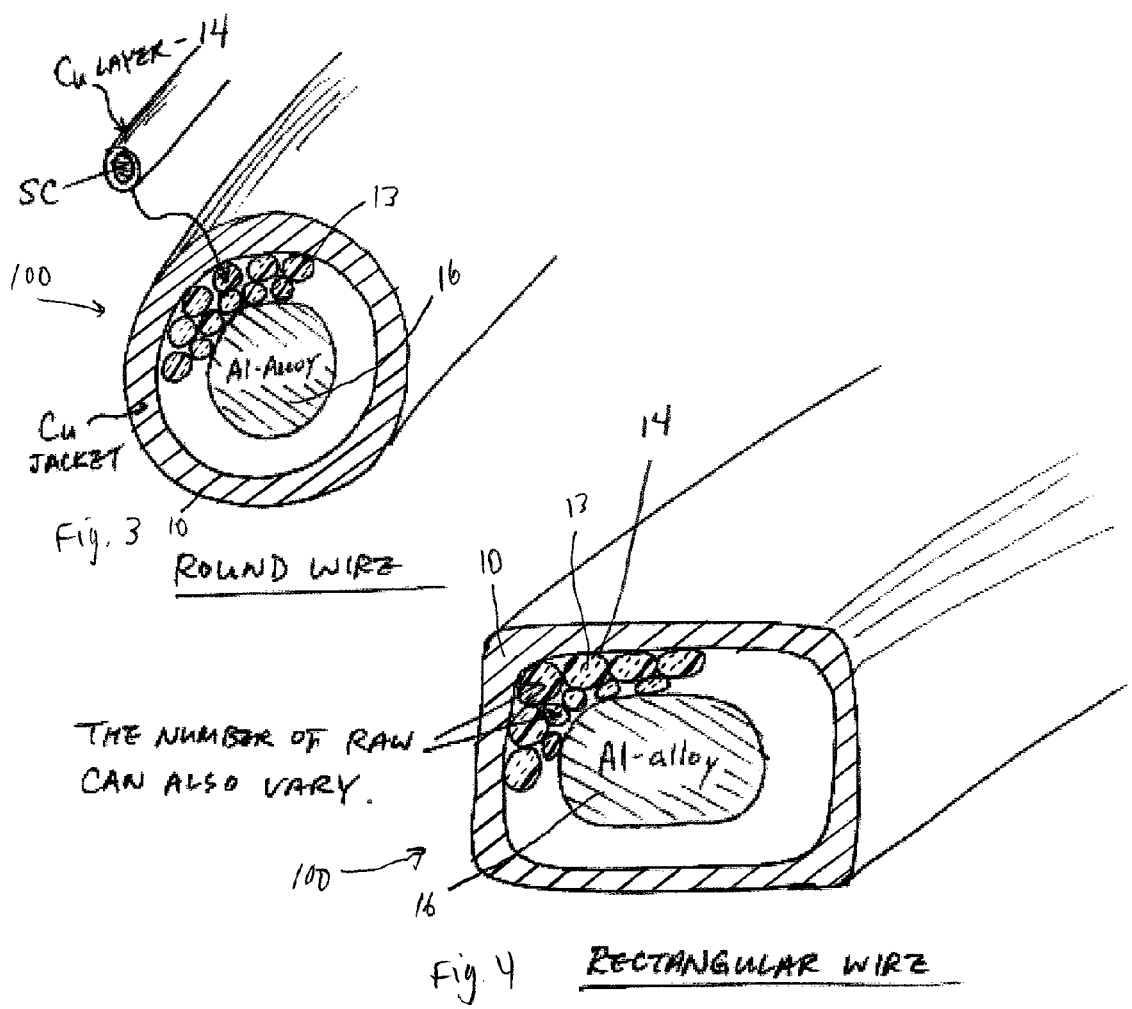

| B | Conventional method | | Cold Assembly (CA) | | CA + Al core | |
|---|---|---|---|---|---|---|
| (T) | Jc | Fp | Jc | Fp | Jc | Fp |
| 3.0 |  |  | 4530 | 13590 | 4578 | 13734 |
| 4.0 | 3500 | 14000 | 3765 | 15060 | 3780 | 15120 |
| 5.0 | 2900 | 14500 | 3096 | 15480 | 3126 | 15630 |
| 6.0 | 2300 | 13800 | 2458 | 14748 | 2508 | 15048 |
| 7.0 | 1700 | 11900 | 1813 | 12691 | 1863 | 13041 | ent
MULTI-STABILIZED NBTI COMPOSITE SUPERCONDUCTING WIRE

FIELD OF THE INVENTION

The present invention relates to a light-weight, aluminum core, multi-stabilized, superconducting wire having improved electrical and mechanical properties.

BACKGROUND OF THE INVENTION

Applications for superconductors such as MRI typically use multi-filamentary NbTi composites with a single stabilizing normal metal-oxygen-free copper. Copper has a few disadvantages in comparison to aluminum including cost and weight. In high-field MRI magnets where the cost and the weight of the superconducting wire are significant, there is a need for a less expensive, lighter superconducting wire, which still retains overall wire performance.

SUMMARY OF THE INVENTION

The present invention meets the above-described need by providing a lightweight composite superconductor in which filaments of the superconductor are embedded in a normal stablilizing metal matrix encapsulating a central core consisting of a lighter metal such as aluminum. The aluminum is very likely to provide additional stabilization. The relative volume fractions of the aluminum core, superconductor filaments and copper matrix may be adjusted to suit particular applications. The aluminum core provides a means to reduce the weight of the composite conductor.

One object of the present invention is to provide a cost-effective method of manufacturing a light-weight aluminum core multi-stabilized superconducting wire with significant benefits in superconductor wire performance.

Another object of the present invention is to provide an aluminum core multi-stabilized superconducting wire having lower resistivity and enhanced mechanical properties.

A further object of this invention is to provide a superconducting wire for use in high field and large MRI applications.

The superconductor effectively utilizes the advantageous properties of aluminum, e.g., lower resistivity at cryogenic temperatures of aluminum compared to copper. Aluminum also has a higher thermal conductivity at cryogenic temperatures and a lower specific gravity than copper.

BRIEF DESCRIPTION OF THE DRAWINGS

FIG. 2 is a cross-sectional view of another embodiment of the present invention.

FIG. 3 is a perspective view of another alternate embodiment of the present invention.

FIG. 4 is a perspective view of another alternate embodiment of the present invention.

DETAILED DESCRIPTION OF THE PRESENT INVENTION

Figure 1:
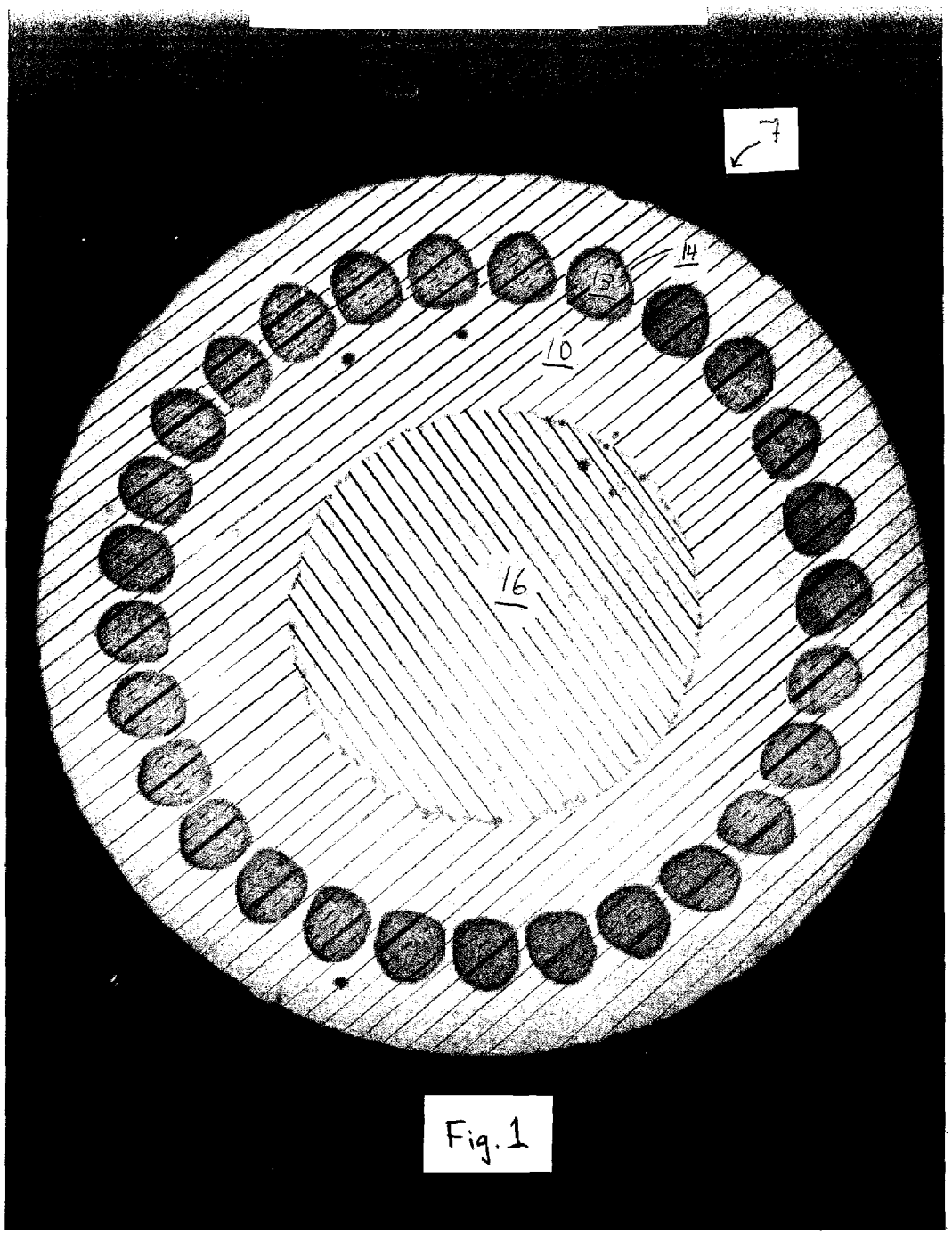
FIG. 1 is a cross-sectional view of one embodiment of the superconductor of the present invention.

In FIG. 1, an aluminum core multi-stabilized NbTi composite superconductor 7 has a copper jacket 10 (that serves as a stabilizer), the superconductor is comprised of multi-filamentary NbTi rods 13, which are coated with a layer of copper 14. The copper coated multifilamentary NbTi rods 13 are surrounded by the copper jacket 10, and an aluminum alloyed core 16. The aluminum used for the core 16 may be a pure metal or a dilute alloy. In a particular embodiment of this invention, the aluminum alloy used is aluminum 2011. The typical chemical composition of this alloy is: Si—0.4%, Fe—0.7%, Cu—5.0-6.0%, Pb—0.2-0.6%, Bi—0.2-0.6%, Zn—03%, Other—0.15%, Al—Balance (around 93%). In another embodiment of the present invention, the aluminum alloy has a purity in the range of 90 to 99.5%.

The aluminum core may impart cryogenic stability and/or strength that are comparable to present day composite superconductors. Through the use of a high-purity aluminum core, it is also possible to increase cryogenic stability of the overall conductor beyond what is possible with copper.

Unexpectedly, the inventors have found that even when the present invention uses an aluminum alloy that does not have high purity, the superconductor still obtains all of the advantages as when a high purity aluminum metal core is used, including having an improved residual resistivity ratio, improved mechanical properties, and reduced wire density.

In one embodiment of the present invention as shown in FIGS. 1 and 2, the array of superconducting wires 13 may be formed in the shape of a single concentric ring. In another embodiment of the present invention, the superconductor wires 13 may be formed in the shape of several concentric rings.

The volume fraction of the aluminum metal core can be from 5% up to and including 60% in volume. The volume fraction of the multifilamentary NbTi rods are in the range of 10 to 50% of the total volume. The volume fraction of the copper is in the range of 10 to 80% of the total volume.

In one particular embodiment, the volume component of each component is: copper—0.652, aluminum—0.220, and superconductor—0.128. In another embodiment, the volume component of each component is: copper is present in a volume of about 0.422, aluminum is present in a volume of about 0.450, and superconductor is present in an amount of about 0.128

FIGS. 3 and 4 depict alternative configurations of the present invention. The superconductor 100 can be either round (as shown in FIG. 3) or rectangular in shape (FIG. 4). Also, this embodiment of the present invention includes an array of superconducting wires 13 coated with a layer of copper 14 arranged in multiple concentric rings as well as non-concentrically distributed patterns.

The invention can be produced in many ways as will be evident to those of ordinary skill in the art based on this disclosure. One way is by the "cold-assembly" approach which is described in U.S. Pat. No. 7,155,806 which is incorporated herein by reference. In this method, the central copper core rod (reference number 20 in FIG. 2) is simply replaced by an aluminum member. All the other steps remain the same as described in the patent. Because the filaments of the NbTi alloy are mechanically strong and are embedded in a suitably strong copper matrix the filaments will co-reduce uniformly without causing irregularities in the cross section.

Another method of producing the invention is by cladding as described in U.S. Pat. No. 5,689,875 which is incorporated herein by reference. By replacing the core element 13 with an aluminum rod and repeating the process, a light-weight conductor is provided. Another approach is to assemble NbTi rods that have been clad with some copper around a central aluminum core. The copper clad NbTi rods can be round or hexagonal in cross-section.

Another method of manufacture is by assembling NbTi rods in a billet which is then extruded. The core of the billet will then be made from aluminum. The NbTi rods can be inserted into holes of a gun-drilled copper billet.

The superconductor wire of the present invention is improved in its residual resistivity ratio (RRR). To compare, the RRR for an Al-cored composite superconductor of this invention, is around 300. The RRR for a Cu-cored composite with cold-assembly method is around 130. Finally, the RRR for a hot-processed conventional material superconductor is around 120. It is believed that the higher RRR value of the Al-cored material is due to the much lower resistivity of Al-cored composite wire at low temperatures. Low temperatures include temperatures below the critical temperature of NbTi superconductor at around 10 K, which is the temperature that the superconducting wires require to be operable.

Another advantage of the present invention is the improvement in mechanical properties. To compare, the mechanical properties, 0.05% proof strength and UTS, respectively, are around 290 and around 600 for an Al-cored composite superconductor (made by the cold-assembly method) of this invention. The 0.05% proof strength and UTS for a Cu-cored composite with cold-assembly method are around 200 and around 450, respectively. Finally, the 0.05% proof strength and UTS for a hot-processed conventional material superconductor are around 180 and around 400 respectively.

Figure 5:
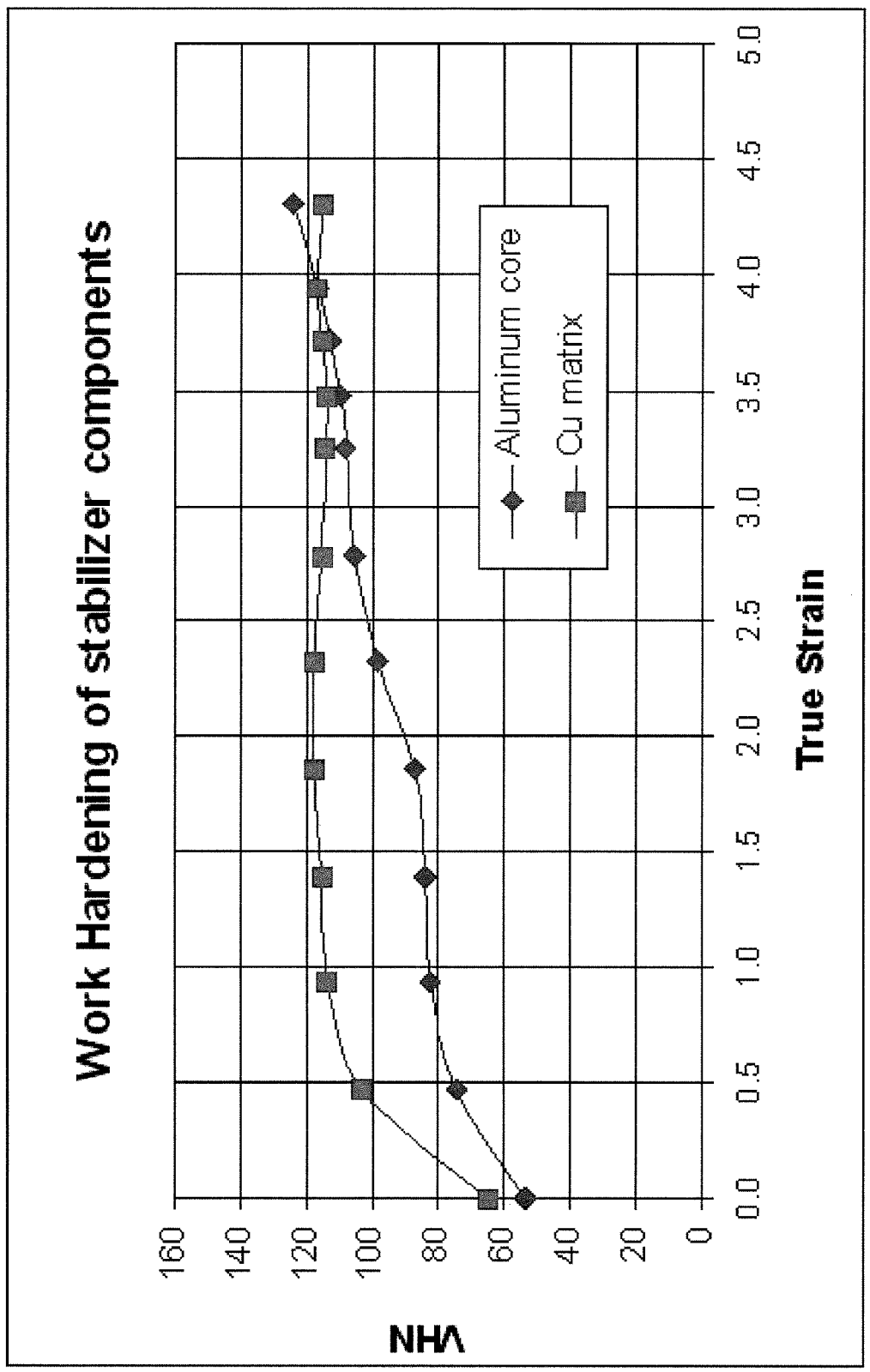
FIG. 5 is a graph of Vickers Hardness Number (VHN) vs. Strain for the aluminum alloying and copper components of one embodiment of the present invention.

The mechanical improvement may be explained by the work hardening characteristics of aluminum alloying used in this particular composite. As shown in FIG. 5, which depicts Vickers hardness as a function of strain, copper does not work harden as much after it reaches a hardness of around 120. In contrast, the Al-alloy continuously work hardens as the wire is reduced. A cross-over of the composite wire was found at a strain level of around 4.

A further advantage of the present invention is that the wire mass density is reduced by one third over the conventional non-aluminum stabilized superconductor wire.

The superconducting wire of the present invention is primarily suitable for use in magnetic resonance imaging (MRI) applications, particularly for high field MRI, which requires a large quantity of superconducting wire.

Figures 6, 7:
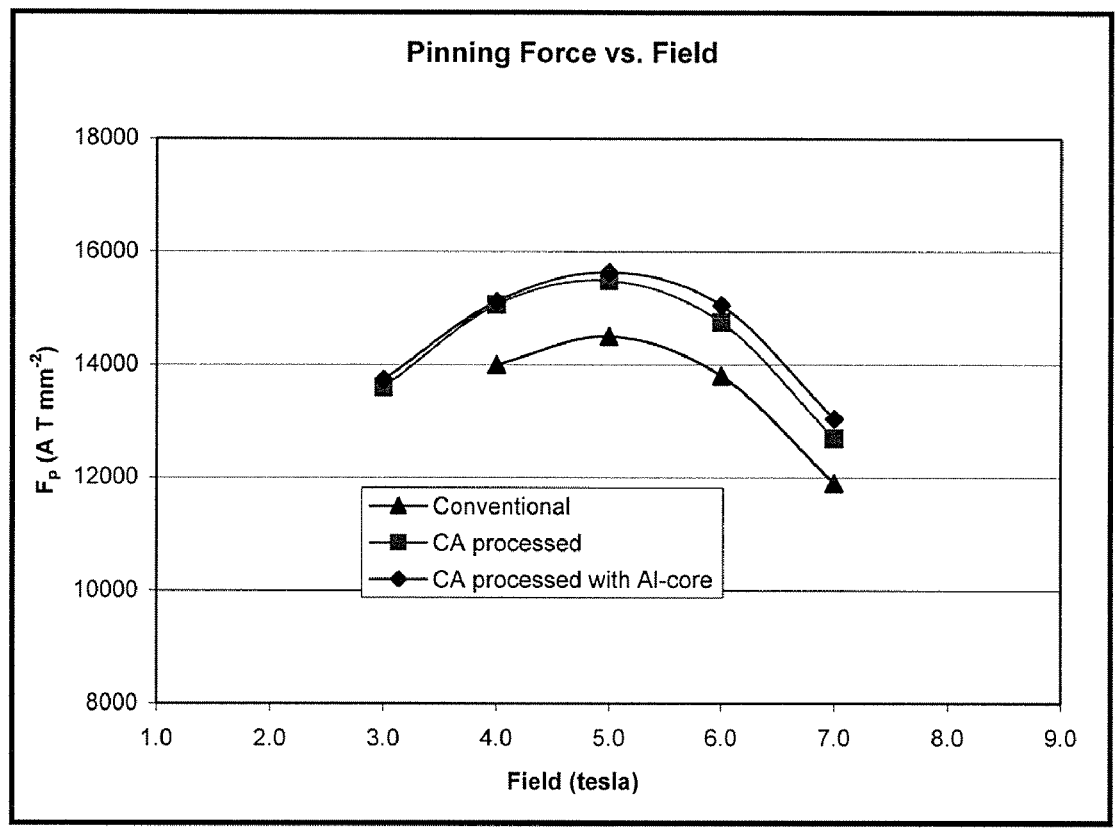
FIG. 6 is a table comparing the Jc and Fp of different superconductor wires.
FIG. 7 is a graph of Pinning Force vs. Applied Magnetic Field.

FIG. 6 is a table comparing the critical current density (Jc) and Pinning force (Fp) of superconductor wires prepared conventionally, by cold assembly without an aluminum core and by cold assembly with an aluminum core. Pinning force (Fp) is one of the most significant properties of superconducting materials. This property is correlated to the critical current density (Jc). Fp is another measure for demonstrating superconductor performance for an MRI application, wherein a higher Fp value indicates better performance at certain magnetic fields.

As can be seen in FIG. 6, the superconductor wire produced by the cold assembly method with an aluminum core has higher Jc and Fp values at all Field (B) values than the conventional superconductor wire and the cold-assembly without an aluminum core superconductor wire. However, the difference in the Jc values between the two wires made by the cold-assembly method is very insignificant and does not appear to be affected by the core material. The inventors have unexpectedly found that the superconductor of the present invention retains the high Jc of the prior art superconductor wires, while advantageously having a lower superconductor wire mass.

FIG. 7 depicts a plot of pinning force (Fp) vs. Applied Magnetic Field (B). The ▲ is a plot for a conventional superconductor wire. The ■ plots the relationship between Fp and B for a cold assembled superconductor wire without an aluminum core, while the ♦ plots the relationship for a cold assembled superconductor wire with an aluminum core. As can be seen, the difference in Fp between the two cold assembled (CA) processed materials is insignificant. FIG. 7 indicates that an aluminum-cored wire will still retain all the advantage of the cold-assembly method, while exhibiting additional benefits including lighter weight, a higher RRR, and improved mechanical properties.

The present invention provides an economic advantage in that the material cost of the aluminum core in the unit assembly is much lower than copper. Furthermore, the density of the superconducting wire of the present invention is lower than that of a conventional superconducting wire.

What is claimed is:

1. A multistabilized superconductor wire comprising:
a metal core;
a copper jacket surrounding the metal core; and
copper-coated multi-filamentary NbTi rods surrounding the metal core and disposed between the metal core and copper jacket.

2. The superconductor of claim 1, wherein the metal core is comprised of aluminum.

3. The superconductor of claim 1, wherein the metal core is comprised of an aluminum alloy.

4. The superconductor of claim 3, wherein the aluminum alloy is further comprised of aluminum having a purity in the range of 90% to 99.5%.

5. The superconductor of claim 1, wherein the metal core further comprises in the range of 5 to 60% of the total volume.

6. The superconductor of either of claim 1 or claim 5, wherein the multi-filamentary NbTi rods comprise in the range of 10 to 50% of the total volume.

7. The superconductor of either of claim 1 or claim 5, wherein the copper jacket comprises in the range of 10% to 80% of the total volume.

8. The superconductor of claim 1, wherein the residual resistivity ratio is around 300.

9. A multistabilized superconductor wire comprising:
an aluminum metal core;
a copper jacket surrounding the aluminum core; and
copper-coated multi-filamentary NbTi rods surrounding the aluminum core and disposed between the aluminum core and copper jacket.

10. The superconductor of claim 9, wherein the aluminum core further comprises in the range of 5 to 60% of the total volume, wherein the multi-filamentary NbTi rods comprise in the range of 10 to 50% of the total volume, and wherein the copper jacket comprises in the range of 10% to 80% of the total volume.

11. The superconductor of claim 9, wherein the residual resistivity ratio is around 300.

12. The superconductor of claim 9, wherein the metal core is comprised of high purity aluminum.

13. The superconductor of claim 9, wherein the metal core is comprised of an aluminum alloy.

* * * * *